United States Patent
Lu (10) Patent No.: US 12,108,590 B2
(45) Date of Patent: Oct. 1, 2024

(54) SEMICONDUCTOR STORAGE DEVICE AND FORMING METHOD THEREOF

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 222 days.

(21) Appl. No.: 17/706,333

(22) Filed: Mar. 28, 2022

(65) Prior Publication Data
US 2023/0042535 A1 Feb. 9, 2023

Related U.S. Application Data

(63) Continuation of application No. PCT/CN2021/112209, filed on Aug. 12, 2021.

(30) Foreign Application Priority Data

Aug. 5, 2021 (CN) .......................... 202110894701.4

(51) Int. Cl.
*H10B 12/00* (2023.01)
*H01L 21/762* (2006.01)
*H01L 29/06* (2006.01)

(52) U.S. Cl.
CPC ....... *H10B 12/30* (2023.02); *H01L 21/76224* (2013.01); *H01L 29/0649* (2013.01); *H10B 12/02* (2023.02)

(58) Field of Classification Search
CPC ...... H10B 12/30; H10B 12/02; H10B 12/053; H10B 12/34; H10B 12/488; H01L 21/76224; H01L 29/0649
See application file for complete search history.

(56) References Cited

U.S. PATENT DOCUMENTS

2013/0328160 A1* 12/2013 Ota .................... H10B 12/488
257/506

FOREIGN PATENT DOCUMENTS

CN 108962892 A 12/2018
CN 108962891 B 11/2019

OTHER PUBLICATIONS

English abstract of CN 108962891 B.
English abstract of CN 108962891 A.

* cited by examiner

Primary Examiner — Karen Kusumakar
Assistant Examiner — Adam S Bowen
(74) Attorney, Agent, or Firm — Kilpatrick Townsend & Stockton LLP (57) ABSTRACT

The disclosure relates to a semiconductor storage device and a forming method thereof. The semiconductor storage device includes a substrate; a plurality of active region structures provided on the substrate; a shallow trench isolation structure provided within the substrate, the shallow trench isolation structure surround the plurality of active region structures; a plurality of conductive line structures, extending parallel to each other along a first direction, the conductive line structure include a first region and a second region, the first region being located over each of the plurality of active region structures, the second region is located over the shallow trench isolation structure; in a direction perpendicular to the substrate, the depth of the first region is greater than the depth of the second region.

15 Claims, 9 Drawing Sheets

SEMICONDUCTOR STORAGE DEVICE AND FORMING METHOD THEREOF

CROSS-REFERENCE TO RELATED APPLICATION

This application is a continuation of International Application No. PCT/CN2021/112209 filed on Aug. 12, 2021, the entire contents of which are incorporated herein by reference.

The disclosure claims priority to Chinese Patent Application No. 202110894701.4, filed on Aug. 5, 2021 and entitled "Semiconductor Storage Device and Forming Method thereof", the disclosure of which is hereby incorporated by reference in its entirety.

TECHNICAL FIELD

The disclosure relates to the field of semiconductor technology, and particularly to a semiconductor storage device and a forming method thereof.

BACKGROUND

With the development of Dynamic Random Access Memory (DRAM) preparation, in order to enable a DRAM to have a higher density, sizes of various storage units in the DRAM are reduced, a buried Word Line (WL) structure is typically used.

However, there are still some problems in existing trench gates. When the size of a memory continues to minimally shrink, the buried WL cuts a passing gate region between two active regions, and when reading and writing are repeated, accumulated parasitic electrons are generated in the active regions on both sides. When the parasitic electron flows to a source/drain that is electrically connected to a bit line through a bottom of the other buried WL adjacent to this row of buried WL, it will lead to reading and writing errors of the column bit line data. This phenomenon is called row hammer effect.

SUMMARY

Embodiments of the disclosure provide a semiconductor storage device and a forming method thereof.

According to some embodiments, one aspect of the disclosure provides a semiconductor storage device, which includes a substrate, a plurality of active region structures, a shallow trench isolation structure, and a plurality of conductive line structures.

The plurality of active region structures are provided on the substrate.

The shallow trench isolation structure is provided within the substrate, and the shallow trench isolation structure surrounds the plurality of active region structures.

The plurality of conductive line structures extend parallel to each other along a first direction, each of the plurality of conductive line structures includes a first region and a second region, the first region is located over each of the plurality of active region structures, the second region is located over the shallow trench isolation structure; in a direction perpendicular to the substrate, a depth of the first region is greater than a depth of the second region.

According to some embodiments, the other aspect of the disclosure provides a method for forming a semiconductor storage device, which includes the following operations.

A substrate is provided.

A plurality of active region structures and a shallow trench isolation structure are formed on the substrate, the shallow trench isolation structure surrounds the plurality of active region structures.

The plurality of active region structures and the shallow trench isolation structure are etched for the first time to form a plurality of conductive line trenches that extend parallel to each other along a first direction, in the first etching, the etching rate of the plurality of active region structures is greater than the etching rate of the shallow trench isolation structure.

A conductive line structure is formed in the plurality of conductive line trenches, the conductive line structure includes a first region and a second region, the first region is located over each of the plurality of active region structures, the second region is located over the shallow trench isolation structure; a depth of the first region is greater than a depth of the second region.

BRIEF DESCRIPTION OF THE DRAWINGS

In order to describe the technical solutions in the embodiments of the disclosure or a conventional technology more clearly, the drawings required to be used in the embodiments will be simply introduced below. Obviously, the drawings in the following descriptions are only some embodiments of the disclosure. Those of ordinary skill in the art may further obtain other drawings according to these drawings without creative work.

DESCRIPTION OF REFERENCE NUMERALS

10 Substrate
11 Active region structure
12 Shallow trench isolation structure

13 First mask structure
14 Third mask structure
15 Conductive line trench
16 Fifth mask structure
17 Fourth mask structure
20 First region
21 Gate structure
22 Barrier layer
23 First sub-conductive layer
24 Insulating sidewall
25 Second sub-conductive layer
26 Third sub-conductive layer
27 Fourth sub-conductive layer
30 Second region
40 Capping layer
90 First direction
91 Second direction
92 Third direction

DETAILED DESCRIPTION OF THE EMBODIMENTS

The technical solution in embodiments of the disclosure will be described clearly and completely in conjunction with the drawings in the embodiments of the disclosure. Obviously, the described embodiments are a part of, but not all of the embodiments of the disclosure. Based on the embodiments in the disclosure, all other embodiments obtained by those of ordinary skill in the art without creative work shall fall within the protection scope of this disclosure.

A dynamic random access memory (DRAM) belongs to a volatile memory that includes an array region composed of a plurality of storage units and a peripheral region composed of a control circuit. Each of the storage units includes a transistor electrically connected to a capacitor, the transistor controls storage or release of charges in the capacitor to achieve the purpose of storing data. The control circuit may be positioned to each storage unit through a character line and a bit line that span across an array region and are electrically connected to each of the storage units to control storage or release of its data.

In a related art, in order to enable the DRAM to have a higher density, a buried WL is typically used, thereby reducing the size of each of the storage units in the DRAM.

However, there are still some problems in a trench gate in the related art. When the size of a memory continues to minimally shrink, the buried WL cuts a passing gate region between two active regions, and when reading and writing are repeated, accumulated parasitic electrons are generated in the active regions on both sides. When the parasitic electron flows to a source/drain that is electrically connected to a bit line through a bottom of the other buried WL adjacent to this row of buried character line, it will lead to data errors of the column bit line, so that the problem of row hammer effect occurs.

A semiconductor storage device is provided in the embodiments of the disclosure, which includes a substrate, a plurality of active region structures provided on the substrate; a shallow trench isolation structure provided within the substrate, the shallow trench isolation structure surrounding the plurality of active region structures; a plurality of conductive line structures, extending parallel to each other along a first direction, each of the plurality of conductive line structures including a first region and a second region, the first region being located over each of the plurality of active region structures, the second region being located over the shallow trench isolation structure; in a direction perpendicular to the substrate, a depth of the first region is greater than a depth of the second region. As such, it makes it possible to prevent adjacent bit lines from occurring data errors there between, thereby avoiding the problem of row hammer effect.

Figure 1:
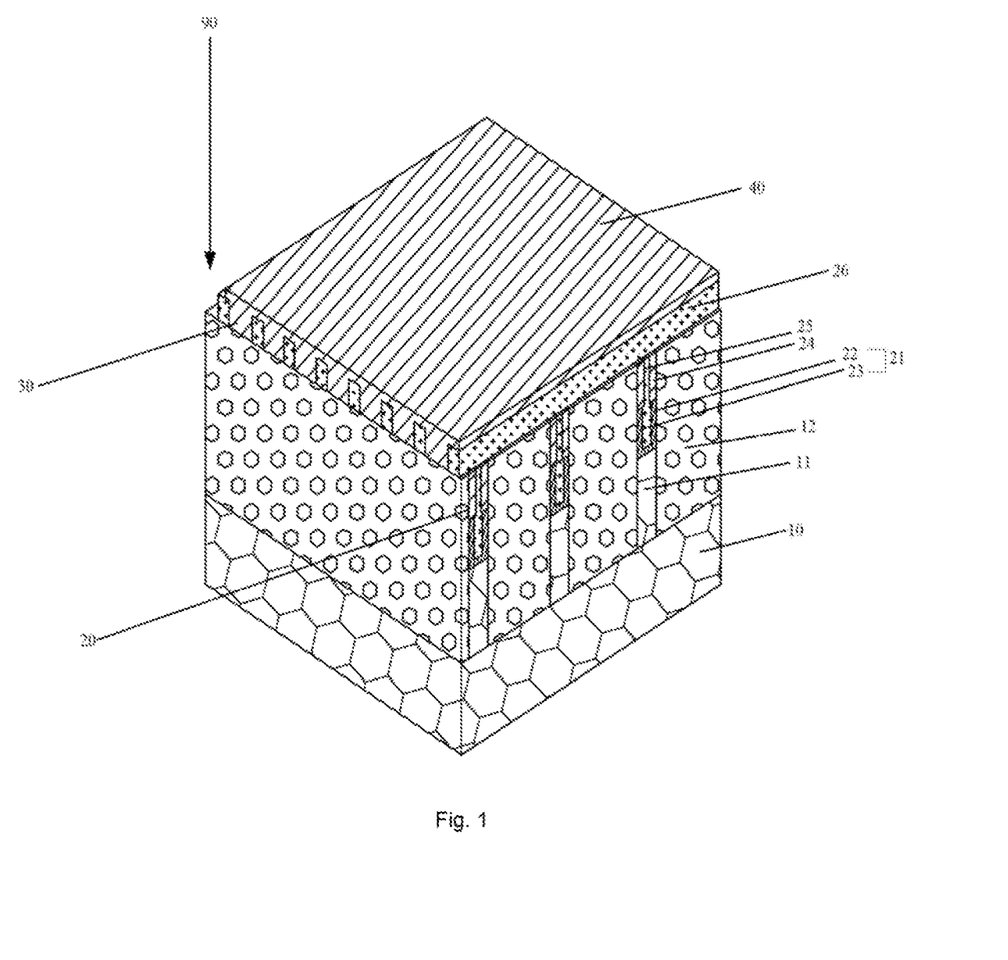
FIG. 1 is a schematic structural diagram of a semiconductor storage device in embodiments of this disclosure.

Based on the above-mentioned embodiments, referring to FIG. 1, which is a schematic structural diagram of a semiconductor storage device in embodiments of this disclosure, the semiconductor storage device includes a substrate 10, for example, the semiconductor substrate 10 is composed of silicon. Then, a plurality of active region structures 11 are provided on the substrate 10, that is, a surface of the substrate 10 is connected to a surface of each of the plurality of active region structures 11, an upper surface of the substrate 10 is connected to the plurality of active region structures 11, each of the active region structures 11 is in the shape of an island-shaped pillar. A shallow trench isolation structure 12 is provided within the substrate 10, the shallow trench isolation structure 12 surrounds the plurality of active region structures 11, the shallow trench isolation structure 12 is configured to isolate the plurality of active region structures 11, that is, each of the active region structures 11 is isolated from one another by the shallow trench isolation structure 12, the various active region structures 11 are disconnected from one another. Further, the semiconductor storage device includes the plurality of conductive line structures, the plurality of conductive line structures extending parallel to each other along a first direction 90, each of the conductive line structures includes a first region 20 and a second region 30, the first region 20 is located over each of the plurality of active region structures 11, the second region 30 is located over the shallow trench isolation structure 12; and the first region 20 and the second region 30 are formed by etching along a direction perpendicular to the substrate 10, a depth of the first region 20 is greater than a depth of the second region 30.

In embodiments of the disclosure, the first region 20 of the conductive line structure includes a gate structure 21, insulating sidewall 24, and a second sub-conductive layer 25, and a third sub-conductive layer 26. The gate structure 21 is located at a bottom of the first region 20, and a bottom of the gate structure 21 is connected to a bottom surface of the first region 20; the insulating sidewall 24 is located at a portion of sidewall over a barrier layer 22 of the first region 20 of the conductive line structure, the second sub-conductive layer 25 is provided at an innerside of the insulating sidewall 24, the insulating sidewall 24 is provided around the second sub-conductive layer 25, that is, the insulating sidewall 24 is deposited at a sidewall surface of the first region 20, and is provided around the second sub-conductive layer 25. A preferred embodiment provided in the embodiments of the disclosure is that the insulating sidewall 24 completely wraps up the second sub-conductive layer 25. A bottom of the second sub-conductive layer 25 is connected to a top surface of the gate structure 21, and top surfaces of the second sub-conductive layer 25 and an insulating inner wall are flush with an opening edge of the first region 20; a third sub-conductive layer 26 overlies the insulating sidewall 24 and the second sub-conductive layer 25, and is connected to the second region 30 of the conductive line structure.

The gate structure 21 includes the barrier layer 22 and the first sub-conductive layer 23, the barrier layer 22 is located at a portion of a sidewall of the bottom of the first region 20, the first sub-conductive layer 23 is provided within the barrier layer 22, that is, the barrier layer 22 is deposited at the portion of the sidewall and a bottom surface of the bottom of the first region 20, a bottom of the first sub-conductive layer 23 and the bottom surface of the first region 20 of the conductive line structure, and is provided within the barrier layer 22. A preferred embodiment provided in the embodiments of the disclosure is that the barrier layer 22 completely wraps up the first sub-conductive layer 23.

Further, in the embodiments of the disclosure, the semiconductor storage device further includes a capping layer 40, the capping layer 40 is filled inside the second region 30 and overlies the third sub-conductive layer 26.

It is to be noted that the barrier layer 22 in the embodiments of the disclosure includes metal nitrides, and a material of the insulating sidewall 24 is silicon nitride. Materials of the first sub-conductive layer 23, the second sub-conductive layer 25, and the third sub-conductive layer 26 are tungsten or polysilicon, the material of the first sub-conductive layer 23 is the same as those of the second sub-conductive layer 25 and the third sub-conductive layer 26. Of course, materials of various structures in the embodiments of the disclosure are not limited.

It is to be further noted that the depth of the first region 20 and the depth of the second region 30 may be set by itself, but the depth of the first region 20 needs to be greater than the depth of the second region 30, for example, the depth of the first region 20 is ½ to ¾ of the depth of the second region 30; the height of the gate structure 21 may be set by itself, for example, the height of the gate structure 21 is ¼ of the depth of the first region 20 the heights of the insulating sidewall 24 and the second sub-conductive layer 25 may be set by itself, for example, the heights of the insulating sidewall 24 and the second sub-conductive layer 25 are ¼ of the depth of the first region 20, a thickness of the barrier layer 22 is greater than a thickness of the insulating sidewall 24. The thickness of the barrier layer 22 is 3 nm to 5 nm, the thickness of the insulating sidewall 24 is 5 nm to 10 nm, of course, and the depth and the thickness in the embodiments of the disclosure are not limited.

In the embodiments of the disclosure, an adhesion layer (not shown) is provided on the third sub-conductive layer 26, the adhesion layer includes a titanium nitride, and the embodiments of the disclosure do not impose any limitation on a material of the adhesion layer.

In the embodiments of the disclosure, the semiconductor storage device includes the substrate; the plurality of active region structures provided on the substrate; the shallow trench isolation structure provided within the substrate, the shallow trench isolation structure surrounding the plurality of active region structures; the plurality of conductive line structures, extending parallel to each other along the first direction, the conductive line structure including the first region and the second region, the first region being located over each of the plurality of active region structures, the second region being located over the shallow trench isolation structure; in a direction perpendicular to the substrate, the depth of the first region is greater than the depth of the second region. As such, since the depth of the first region is greater than the depth of the second region, therefore, it is possible to avoid affecting the adjacent active region structures when the bit line structure between the adjacent active region structures in the same direction is energized, thereby reducing the influence of row hammer effect.

Figure 2:
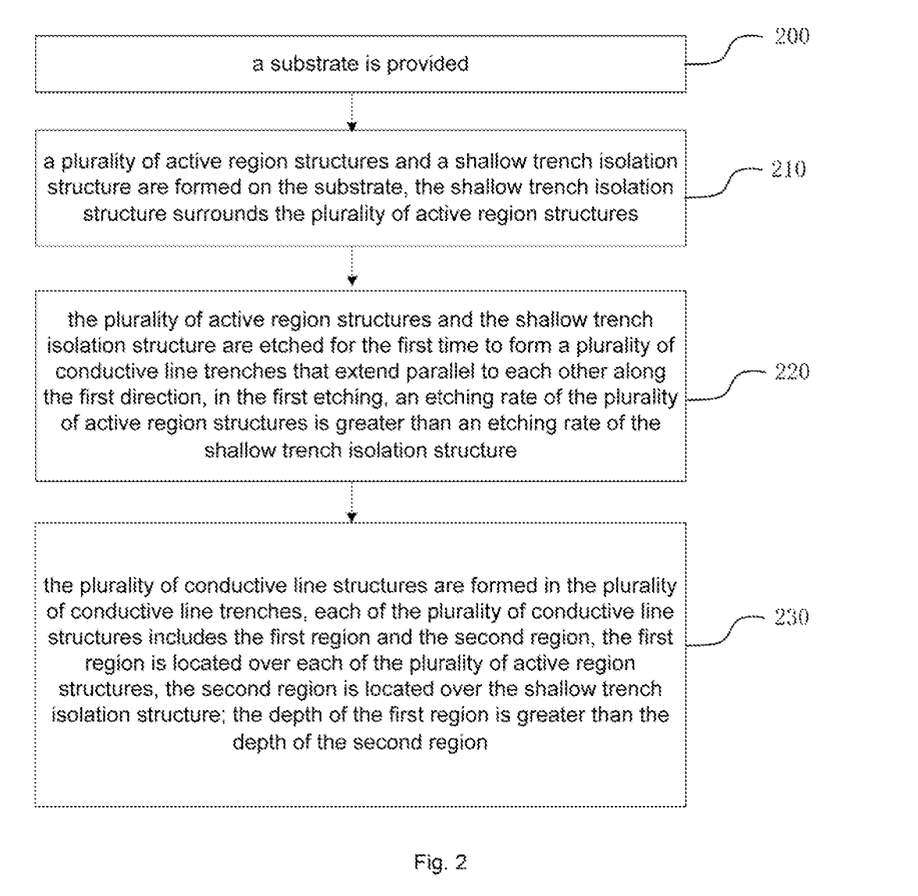
FIG. 2 is a flowchart of a method for forming a semiconductor storage device in embodiments of the disclosure.

Based on the above-mentioned embodiments, the method for forming a semiconductor storage device provided in the embodiments of the disclosure will be described in detail below. Referring to FIG. 2, a flow chart of a method for forming a semiconductor storage device in embodiments of the disclosure specifically includes the following steps.

At S200, a substrate is provided.

In the embodiments of the disclosure, the substrate is provided.

A material of the substrate is silicon, but a material of the substrate is not limited in the embodiments of the disclosure.

At S210, a plurality of active region structures and a shallow trench isolation structure are formed on the substrate, the shallow trench isolation structure surrounds the plurality of active region structures.

In the embodiments of the disclosure, the plurality of active region structures are formed on the substrate, and after the plurality of active region structures are obtained, the shallow trench isolation structure is formed around the plurality of active region structures, therefore the formed shallow trench isolation structure surrounds the plurality of active region structures.

In the embodiments of the disclosure, for forming the plurality of active region structures and the shallow trench isolation structure, a possible embodiment is provided, S210 in the embodiments of the disclosure will be described in detail below, which specifically includes the following steps.

At S1, a plurality of fourth mask structures are formed along a second direction on the substrate, the plurality of fourth mask structures are horizontally arranged.

Figure 3:
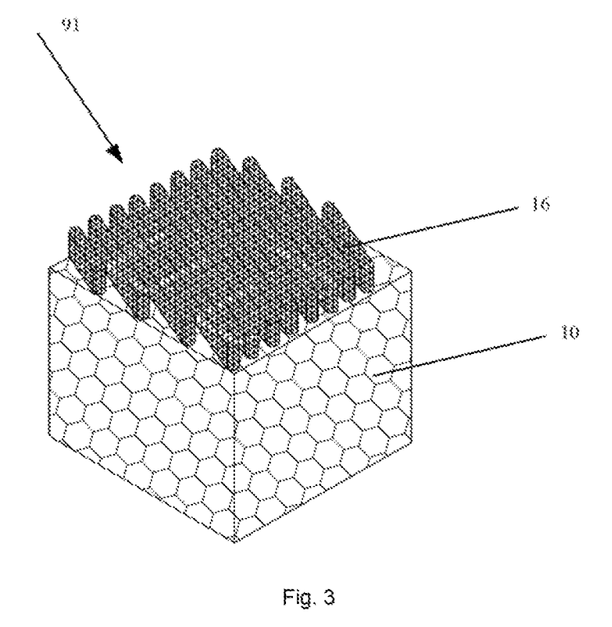
FIG. 3 is a first schematic diagram of a semiconductor storage device in embodiments of this disclosure.

In the embodiments of the disclosure, at first, a plurality of fifth mask structures are formed above the substrate, each of the plurality of fifth mask structures extends along the second direction, and various fifth mask structures are horizontally arranged from one another. Referring to FIG. 3, which is a first schematic diagram of a semiconductor storage device in embodiments of this disclosure, in practice, the plurality of fifth mask layer structures 16 are formed at an upper end surface of the substrate 10, and each of the plurality of fifth mask layer structures 16 is horizontally arranged along a second direction 91 on the substrate 10.

A lower surface of the plurality of the fifth mask structures 16 is connected to an upper surface of the substrate 10.

Figure 4:
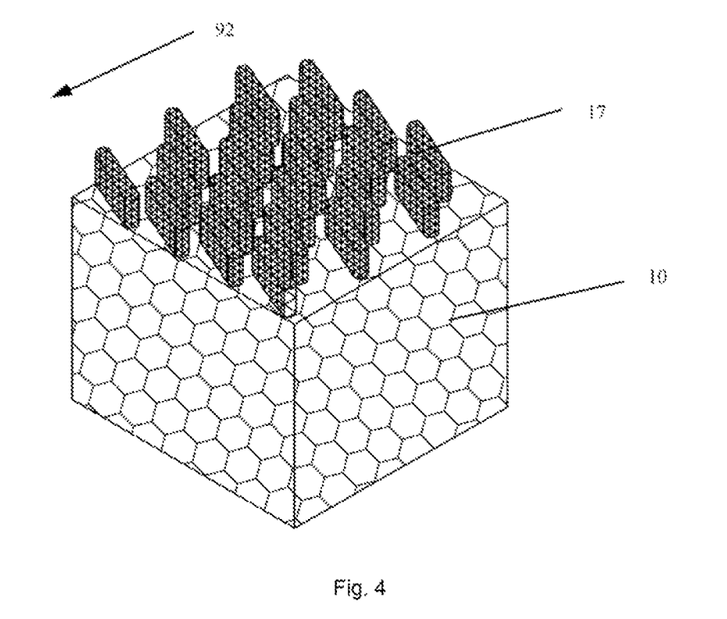
FIG. 4 is a second schematic diagram of a semiconductor storage device in embodiments of this disclosure.

Then, the plurality of fifth mask structures are etched along a third direction, so that the plurality of fourth mask structures are formed, the various fourth mask structures are arranged in a staggered manner. The third direction is a direction perpendicular to the second direction. Referring to FIG. 4, which is a second schematic diagram of a semiconductor storage device in embodiments of this disclosure, since the third direction 92 is a direction perpendicular to the second direction 91, so after the etching, the fourth mask structures 17 arranged in a staggered manner may be formed. That is, the plurality of fourth mask structures 17 are arranged in a staggered manner on the substrate 10.

At S2, the substrate is etched down along the first direction to form the plurality of active region structures.

Figure 5:
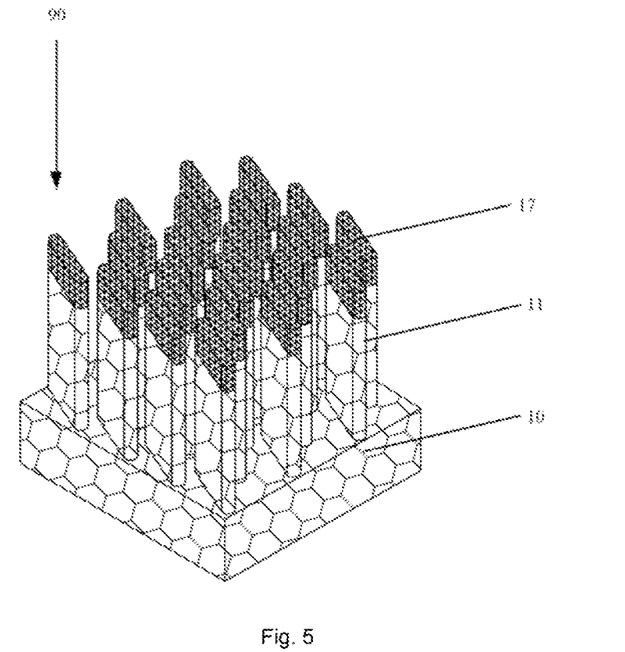
FIG. 5 is a third schematic diagram of a semiconductor storage device in embodiments of this disclosure.

In the embodiments of the disclosure, the substrate is etched down along the first direction to form the plurality of active region structures. That is, in the embodiments of the disclosure, the portion of the substrate outside the plurality of fourth mask structures is etched down along the first direction, so that the plurality of active region structures are formed, each of the plurality of active region structures has the substrate and the fourth mask structure, and the fourth mask structure is connected to a top of the substrate. Referring to FIG. 5, which is a third schematic diagram of a semiconductor storage device in embodiments of this disclosure, in practice, after the various fourth mask structures 17 are formed and arranged in a staggered manner, the substrate 10 is etched down along the first direction 90 to form the plurality of active region structures 11. As shown, a lower half of each of the plurality of active region structures ills the substrate 10, an upper half thereof is the fourth mask structure 17, and the upper surface of the substrate 10 is connected to a lower surface of the fourth mask structure 17.

In the etching process, there is no need to etch the fourth mask structure 17, only a portion of the substrate 10 where the fourth mask structure 17 is not deposited is etched.

At S3, a shallow trench isolation structure is formed around the plurality of active region structures.

Figure 6:
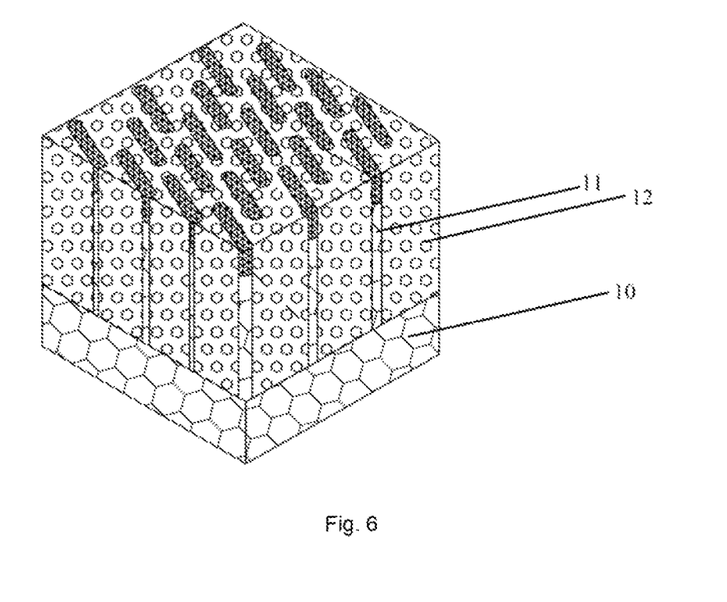
FIG. 6 is a fourth schematic diagram of a semiconductor storage device in embodiments of this disclosure.

In the embodiments of the disclosure, a spacer material is filled above the substrate, until an upper end surface of the spacer material is flush with an upper end surface of each of the plurality of active region structures, so that the shallow trench isolation structure is formed around the plurality of active region structures. Referring to FIG. 6, which is a fourth schematic diagram of a semiconductor storage device in embodiments of this disclosure, in practice, the spacer material is filled above the substrate 10, so that the plurality of active region structures 11 are completely wrapped up within the spacer material to form the shallow trench isolation structure 12. As shown, the substrate 10 includes the plurality of active region structures 11 and the shallow trench isolation structure 12, an upper end surface of the shallow trench isolation structure 12 is flush with the upper end surface of each of the plurality of active region structures 11, the various active region structures 11 are isolated from one another through the shallow trench isolation structures 12.

The shallow trench isolation structure 12 includes silicon oxide, the embodiments of the disclosure does not impose any limitation on the material of the shallow trench isolation structure.

At S220, the plurality of active region structures and the shallow trench isolation structure are etched for the first time to form a plurality of conductive line trenches that extend parallel to each other along the first direction, in the first etching, an etching rate of the plurality of active region structures is greater than an etching rate of the shallow trench isolation structure.

Figure 7:
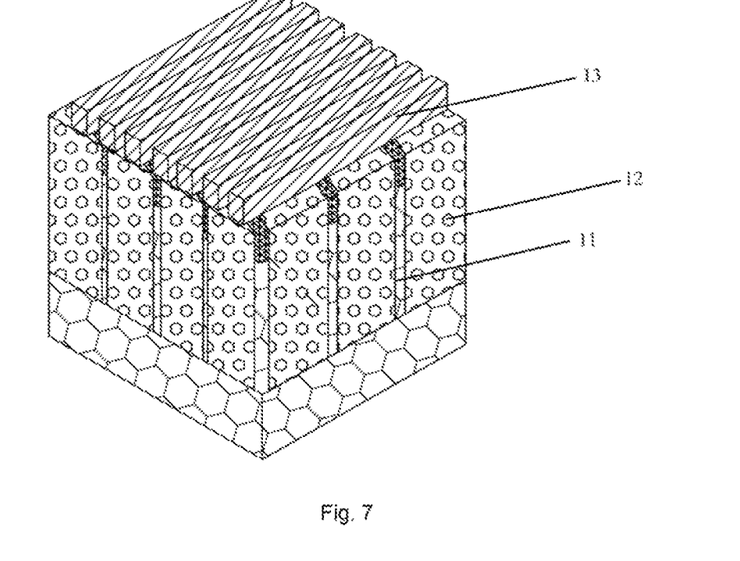
FIG. 7 is a fifth schematic diagram of semiconductor storage device in embodiments of this disclosure.
Figure 8:
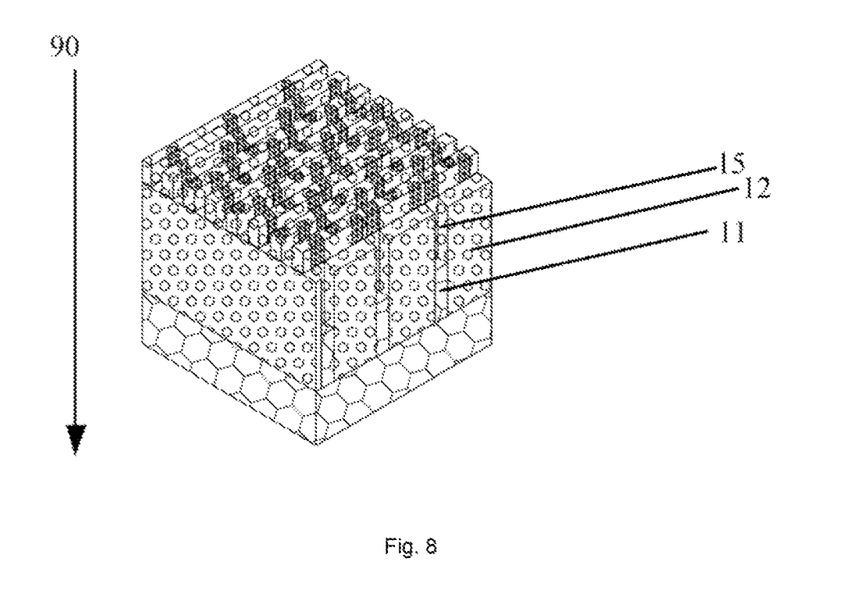
FIG. 8 is a sixth schematic diagram of a conductor storage device in embodiments of this disclosure.

In the embodiments of the disclosure, firstly, a plurality of first mask structures are formed along the first direction over the plurality of active region structures and the shallow trench isolation structure, then, the plurality of active region structures and the shallow trench isolation structure are etched according to the first mask structure, so that a plurality of conductive line trenches are formed extending parallel to each other along the first direction. Referring to FIG. 7, which is a fifth schematic diagram of a semiconductor storage device in embodiments of this disclosure, in practice, the plurality of first mask structures 13 are formed over the plurality of active region structures 11 and the shallow trench isolation structure 12, and each of the first mask structures 13 is horizontally arranged over the plurality of active region structures 11 and the shallow trench isolation structure 12. Referring to FIG. 8, which is a sixth schematic diagram of a semiconductor storage device in embodiments of this disclosure, the first direction 90 is a vertical direction, the plurality of active region structures 11 and the shallow trench isolation structure 12 are etched along the vertical direction, that is, the plurality of active region structures 11 and the shallow trench isolation structure 12 are etched down along the vertical direction, and the etching rate of the plurality of active region structures 11 is greater than that of the shallow trench isolation structure 12, so that the plurality of conductive line trenches 15 are formed extending along the first direction 90.

The width of the first mask structure 13 is a first width, the first direction 90 may be, for example, the vertical direction, the etching rate of the plurality of active region structures 11 and the etching rate of the shallow trench isolation structure 12 may be set by itself. For example, the depth of the conductive line trench 15 obtained after etching is ½ of the height of each of the plurality of active region structures 11, but the embodiments of the disclosure does not impose any limitation on the depth.

For example, assuming that each of the plurality of active region structures has a height of 90 nm, the depth of the conductive line trench is ½ of the height of each of the plurality of active region structures, therefore, the depth of the conductive line trench obtained by etching is 45 nm.

In the embodiments of the disclosure, when the etching is performed for the first time, the etching rate of the plurality of active region structures is greater than that of the shallow trench isolation structure.

At S230, the plurality of conductive line structures are formed in the plurality of conductive line trenches, each of the plurality of conductive line structures includes the first region and the second region, the first region is located over each of the plurality of active region structures, the second region is located over the shallow trench isolation structure; the depth of the first region is greater than the depth of the second region.

In the embodiments of the disclosure, the plurality of conductive line structures are formed in the plurality of conductive line trenches, the generated conductive line structure includes the first region and the second region, the first region is located over each of the plurality of active region structures, the second region is located over the shallow trench isolation structure; the depth of the first region is greater than the depth of the second region.

For example, the conductive line structure in the embodiments of the disclosure includes the first region and the second region, the first region of the conductive line structure includes the gate structure, the insulating sidewall, and the second sub-conductive layer. The steps of forming the gate structure in the embodiments of the disclosure are described in detail below, which specifically includes the following steps.

At S1, the barrier layer is deposited and formed on a sidewall of the conductive line structure.

In the embodiments of the disclosure, by a preset deposition, the barrier layer is deposited and formed within the conductive line structure.

For example, the barrier layer is deposited and formed within all of the conductive line structure.

At S2, the first sub-conductive layer is deposited and formed at an innerside of the barrier layer.

In the embodiments of the disclosure, by the preset deposition, the first sub-conductive layer is deposited and formed at the innerside of the barrier layer.

At S3, the barrier layer and the first sub-conductive layer are etched back to remain portions of the barrier layer and the first sub-conductive layer located at a portion of the bottom of the first region, so that the gate structure is formed.

The barrier layer is located at a portion of a sidewall and a bottom surface of the bottom of the first region of the conductive line structure, the first sub-conductive layer is provided at the innerside of the barrier layer.

In the embodiments of the disclosure, the barrier layer is deposited and formed within the conductive line structure, and the first sub-conductive layer is deposited and formed at the innerside of the barrier layer. Then, by the preset etching method, the barrier layer and the first sub-conductive layer are etched down, and the portions of the barrier layer and the first sub-conductive layer at the bottom of the first region are remained, so that the gate structure containing the barrier layer and the first sub-conductive layer is formed. That is, the gate structure that contains the barrier layer and the first sub-conductive layer is formed at the bottom of the conductive line trench.

Figure 9:
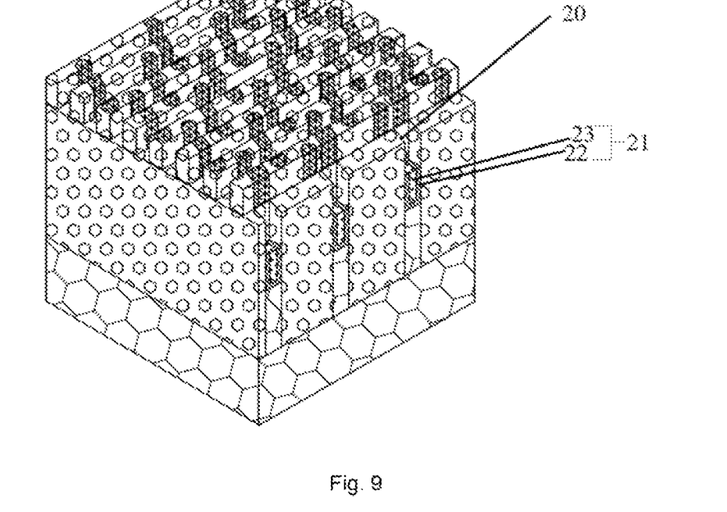
FIG. 9 is a seventh schematic diagram of a semiconductor storage device in embodiments of this disclosure.

For example, referring to FIG. 9, which is a seventh schematic diagram of a semiconductor storage device in embodiments of this disclosure, firstly the barrier layer is deposited within the conductive line structure, and the first sub-conductive layer is formed at the innerside of the barrier layer by a way of deposition, and the barrier layer and the first sub-conductive layer are etched back, so that the gate structure as shown in FIG. 9 is formed. A portion of the sidewall of the bottom of the first region 20 is provided with the barrier layer 20, and the first sub-conductive layer 23 is provided at the innerside of the barrier layer 22, and the barrier layer 22 completely surrounds the first sub-conductive layer 23, so that the gate structure 21 is formed, that is, the gate structure 21 includes the barrier layer 22 and the first sub-conductive layer 23.

The barrier layer includes a metal nitride, which may be, for example, titanium nitride or tantalum nitride, titanium nitride is widely used as the barrier layer of a tungsten plug. The barrier layer has a thickness of 3 nm to 5 nm.

When the barrier layer is deposited and formed, a Chemical Vapor Deposition (CVD) or a Physical Vapor Deposition (PVD) may be used. A preferred embodiment in the embodiments of the disclosure uses the PVD to form the barrier layer, because a titanium nitride film that is formed by the PVD has a higher quality.

Titanium nitride may be deposited by adopting an inorganic chemical agent such as $TiCl_4$ and $NH_3$ at a temperature of 400° C. to 700° C.:6 $TiCl_4$+8 $NH_3 \rightarrow$ 6TiN24HCl+$N_2$, the higher the deposition temperature, the higher the quality of the TiN film, and the lower the chlorine concentration in the film, so that the corrosion effect of chlorine may be reduced.

A material of the first sub-conductive layer includes, but is not limited to, metal or metal alloy, for example, tungsten, aluminum, copper, and alloys thereof, the material is not limited in the embodiments of the disclosure.

The first direction is the vertical direction.

In the embodiments of the disclosure, the first region of the conductive line structure further includes the insulating sidewall and the second sub-conductive layer. The steps of forming the insulating sidewall and the second sub-conductive layer in the embodiments of the disclosure are described in detail below, which specifically includes the following steps.

At S1, after the gate structure is formed, an insulating material is deposited.

In the embodiments of the disclosure, after the gate structure is formed, the insulating material is deposited within the conductive line structure by the preset deposition.

At S2, the insulating material is etched back to fill a trench over the gate structure.

In the embodiments of the disclosure, the insulating material is etched back, the insulating material fills the trench over the gate structure.

The insulating material may completely fill the trench over the gate structure, and may also partially fill the trench over the gate structure, the embodiments of the disclosure does not impose any limitation on this.

At S3, a plurality of second mask structures are formed along the first direction over the insulating material, the width of the second mask structure is a second width, the second width is less than the first width.

In the embodiments of the disclosure, the plurality of second mask structures are formed along the first direction over the insulating material.

The second mask structure is configured to form the insulating sidewall, the width of the second mask structure is the second width, and the second width is less than the first width, so that the formed insulating sidewall have a width greater than the width of the barrier layer.

At S4, the insulating material is etched according to the second mask structure, the insulating sidewall are formed over the barrier layer of the first region.

In the embodiments of the disclosure, the insulating material is etched along the first direction according to the second mask structure to form the insulating sidewall over the bottom barrier layer of the first region, so that the insulating material wrap up a surface of a portion of the sidewall over the bottom barrier layer of the first region.

The material of the insulating sidewall may be, for example, silicon nitride, the insulating sidewall have a thickness greater than the thickness of the barrier layer, and the thickness of the insulating sidewall are 5 nm to 10 nm. When the insulating material is deposited and formed, the CVD or PVD may be used, the embodiments of the disclosure does not impose any limitation on this.

At S3, the second sub-conductive layer is filled at an innerside of the insulating sidewall.

The second sub-conductive layer is provided at the innerside of the insulating sidewall, the insulating sidewall surround the second sub-conductive layer.

Figure 10:
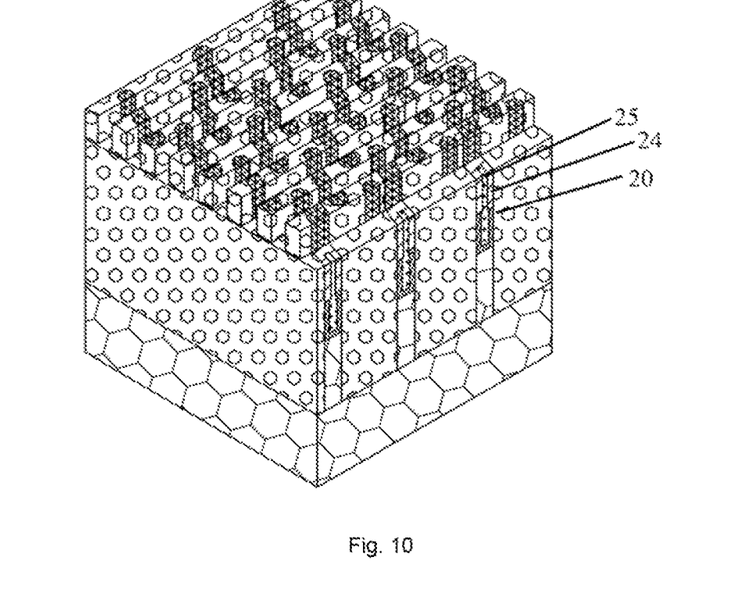
FIG. 10 is an eighth schematic diagram of a semiconductor storage device in embodiments of this disclosure.

In the embodiments of the disclosure, after the insulating sidewall are deposited and formed on a sidewall of the first region, at this time the insulating sidewall and the first region constitute a hollow structure, then the second sub-conductive layer is filled within the formed hollow structure so that the second sub-conductive layer completely fills the first region. Referring to FIG. 10, which is an eighth schematic diagram of a semiconductor storage device in embodiments of this disclosure, the insulating sidewall 24 are deposited and formed within the first region 20, the second sub-conductive layer 25 is filled at the innerside of the insulating sidewall 24 and the first region 20, at this time the second sub-conductive layer 25 is provided at the innerside of the insulating sidewall 24, the insulating sidewall 24 surrounds the second sub-conductive layer 25. It is to be noted that a preferred embodiment in the embodiments of the disclosure is that when the second sub-conductive layer 25 is filled inside the insulating sidewall 24, the second sub-conductive layer 25 completely fills the first region 20, that is, the second sub-conductive layer 25 is flush with an opening edge of the first region 20 while filling.

A material of the second sub-conductive layer includes, but is not limited to, metal or metal alloy, for example, tungsten, aluminum, copper, and alloys thereof, the material is not limited in the embodiments of the disclosure.

The silicon, silicon oxide, silicon nitride etching gas in the embodiments of the disclosure may achieve a certain selection ratio by using $SF_6/CF_4/CL_2/CHF_3/O_2/Ar$ or mixed gas; the material of the insulating sidewall is silicon nitride, and the ALD may be used as a deposition method to deposit the silicon nitride sidewall, and an ALD reactant gas may be $NH_3$ or $N_2/H_2$ mixed reaction gas; a material of the barrier layer is titanium nitride; a material of the capping layer is silicon nitride, silicon nitride may be deposited by the LPCVD or the reactant gas may be $SiH_4$ or $SiH_2/Cl_2$; a material of the spacer layer is silicon oxide, and silicon oxide may be deposited by using the ALD, the reactant gas may be $LTO_{520}/O_2$ or N zero/$O_2$.

The material of the barrier layer is titanium nitride, and may also be, titanium, tantalum, tantalum nitride, tungsten nitride, or a combination thereof, but it is not limited thereto. The material of the first sub-conductive layer is the same as those of the second sub-conductive layer and the third sub-conductive layer. The materials of the first sub-conductive layer, the second sub-conductive layer and the third sub-conductive layer may be aluminum, copper, gold, work function metal, or low-resistive metal, etc., but it is not limited thereto.

A depth of the first region is ½ to ¾ of a depth of the second region, the gate structure has a height that is ¼ of the depth of the first region, the heights of the insulating sidewall and the second sub-conductive layer are ¼ of the depth of the first region, but it is not limited thereto.

In the embodiments of the disclosure, the conductive line structure being formed in the plurality conductive line trenches further includes the following operation.

A fourth sub-conductive layer is deposited on the insulating sidewall and the second sub-conductive layer, the fourth sub-conductive layer fills the conductive line trench.

Figure 11:
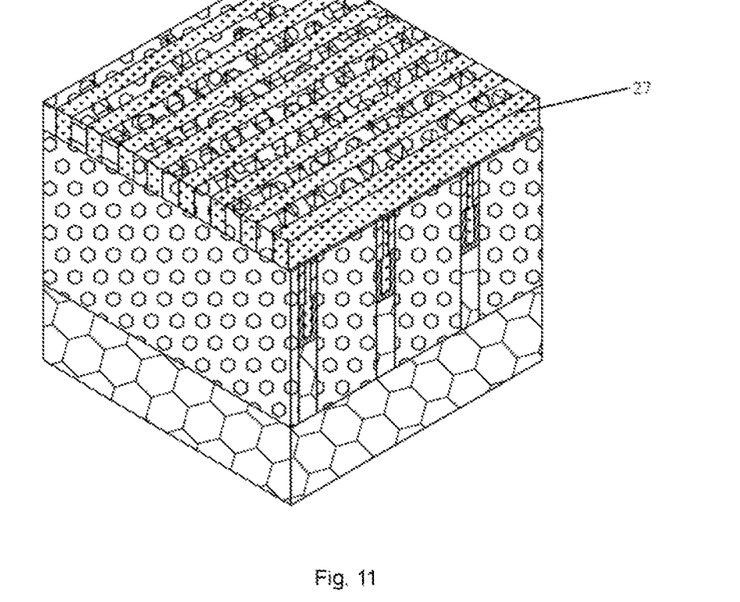
FIG. 11 is a ninth schematic diagram of a semiconductor storage device in embodiments of this disclosure.

In the embodiments of the disclosure, the fourth sub-conductive layer is deposited and formed over the insulating sidewall and the second sub-conductive layer, that is, the fourth sub-conductive layer fills the conductive line trench so that the third sub-conductive layer and the second sub-conductive layer are connected to each other. For example, referring to FIG. 11, which is a ninth schematic diagram of a semiconductor storage device in embodiments of this disclosure, the third sub-conductive layer 26 is filled so that the third sub-conductive layer 26 completely fills the conductive line trench 15.

In the embodiments of the disclosure, in order to reduce interference between the WL, after the bare sub-conductive layer is obtained, the fourth sub-conductive layer may be etched so that the width of the fourth sub-conductive layer is lowered to expose the insulating sidewall and the second sub-conductive layer below, and the second sub-conductive layer is connected in series with the fourth sub-conductive layer so that the third sub-conductive layer is obtained. The following steps to are specifically included.

At S1, a plurality of third mask structures are formed along the first direction over the fourth sub-conductive layer, the width of the third mask structure is less than the second width.

In the embodiments of the disclosure, the plurality of third mask structures are formed along the first direction over the fourth sub-conductive layer, the plurality of third mask structures are configured to form the third sub-conductive layer.

Figure 12:
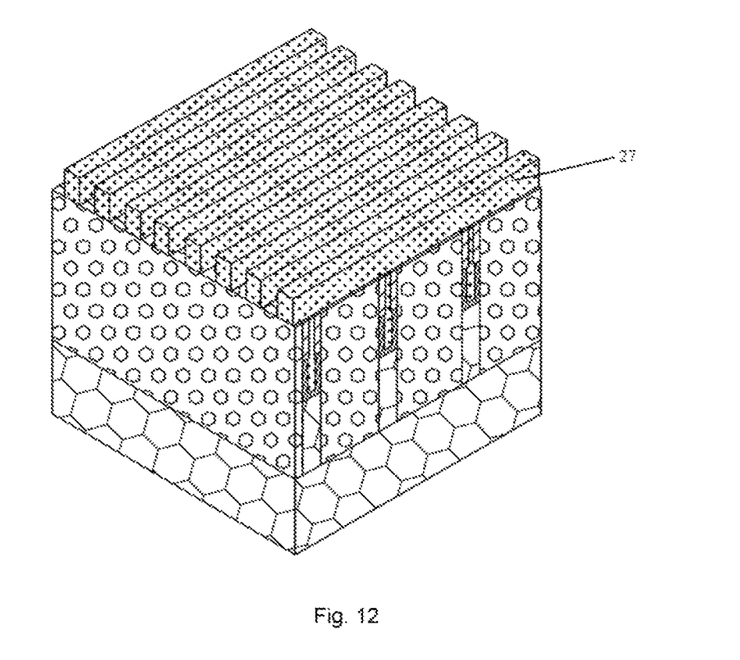
FIG. 12 is a tenth schematic diagram of a semiconductor storage device in embodiments of this disclosure.

For example, referring to FIG. 12, which is a tenth schematic diagram of a semiconductor storage device in embodiments of this disclosure, after the fourth sub-conductive layer 26 fills the conductive line trench, the plurality of active region structures 11 and the shallow trench isolation structure 12 are etched down along the first direction, that is, a dielectric layer within the plurality of active region structures 11 is etched. When the upper surfaces of each of the plurality of active region structures 11 and the shallow trench isolation structure 12 are flush with an upper surface of the fourth sub-conductive layer 26, the semiconductor storage device as shown in FIG. 12 is obtained, and the plurality of the third mask structures (no shown) are formed over the fourth sub-conductive layer 26.

The third mask structure has a width less than the second width.

At S2, the fourth sub-conductive layer is etched according to the third mask structure to form the third sub-conductive layer, the third sub-conductive layer has a width less than or equal to the width of the third mask structure.

In the embodiments of this disclosure, the fourth sub-conductive layer is etched according to the third mask structure to form the third sub-conductive layer.

Figure 13:
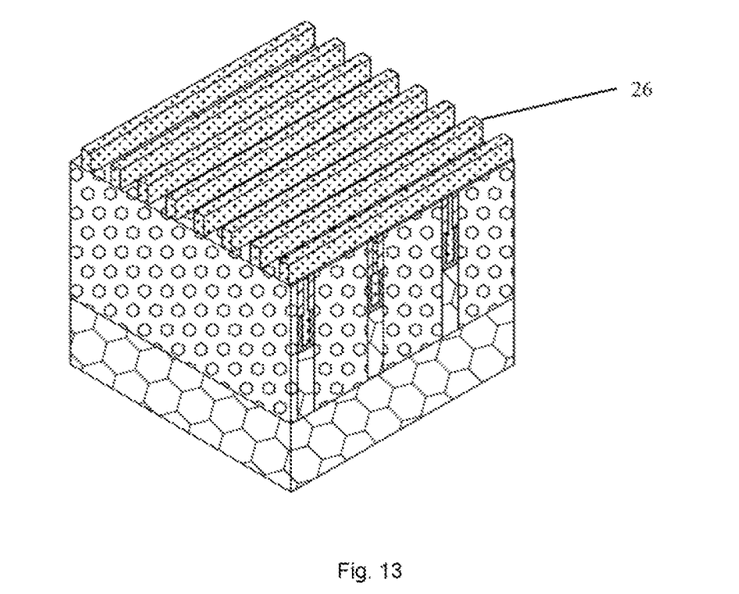
FIG. 13 is an eleventh schematic diagram of a semiconductor storage device in embodiments of this disclosure.

For example, referring to FIG. 13, which is an eleventh schematic diagram of a semiconductor storage device in embodiments of this disclosure, the fourth sub-conductive layer is etched according to the third mask structure (not shown) so that the width of the fourth sub-conductive layer is reduced so as to form the third sub-conductive layer 27. As such, the fourth sub-conductive layer is etched so that the width of the fourth sub-conductive layer is lowered to form the third sub-conductive layer, thereby reducing interference between the WLs.

Figure 14:
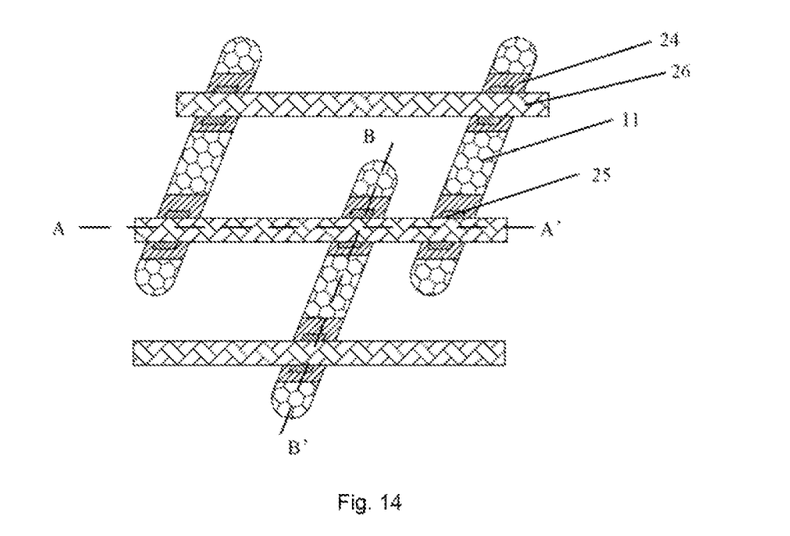
FIG. 14 is a top view of a semiconductor storage device in embodiments of this disclosure.

The top view of the semiconductor storage device in the embodiments of the disclosure will be described in detail below. Referring to FIG. 14, which is a top view of a semiconductor storage device in embodiments of this disclosure, the plurality of active region structures 11, the insulating sidewall 24, the second sub-conductive layer 25, and the third sub-conductive layer 27 are included. The second sub-conductive layer 25 is connected to the third sub-conductive layer 27.

Figure 15:
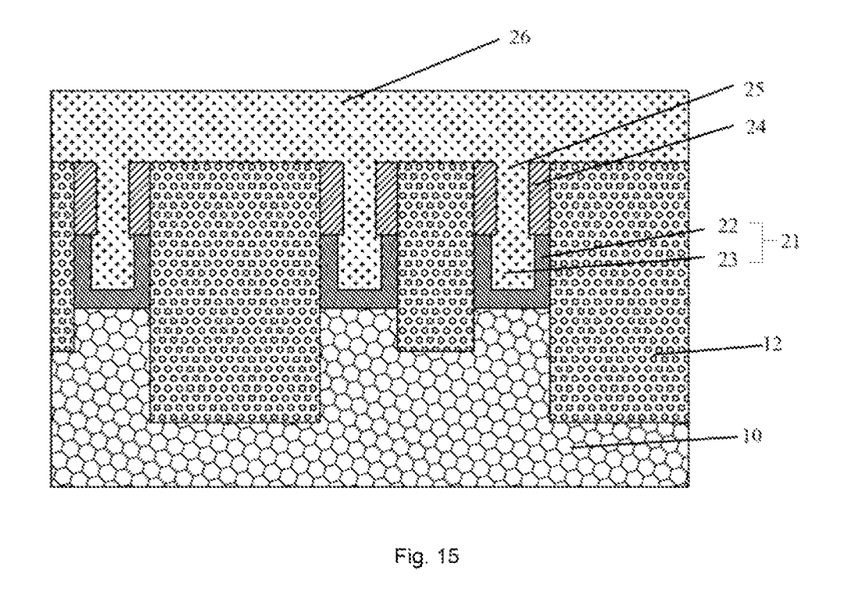
FIG. 15 is a schematic sectional view of AA' in embodiments of the disclosure.
Figure 16:
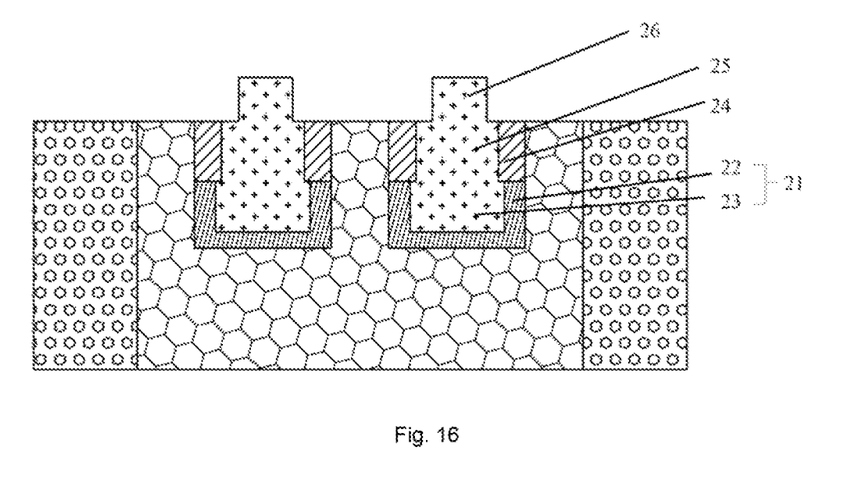
FIG. 16 is a schematic sectional view of BB' in embodiments of the disclosure.

Along an AA' direction in FIG. 16, a section cutting along the AA' direction is obtained. A section AA' of the semiconductor storage device in the embodiments of the disclosure will be schematically described in detail below. Referring to FIG. 15, which is a schematic sectional view AA' in embodiments of the disclosure, the shallow trench isolation structure 12 is provided on the substrate 10, the gate structure 21, the insulating sidewall 24, and the second sub-conductive layer 25 are included in the first region. The gate structure 21 includes the barrier layer 22 and the first sub-conductive layer 23, and the insulating sidewall 24 and the second sub-conductive layer 25 are provided with the third sub-conductive layer 27 thereon.

Along a BB' direction in FIG. 16, a section cutting along the BB' direction is obtained. A section BB' of the semiconductor storage device in the embodiments of the disclosure will be schematically described in detail below. Referring to FIG. 16, which is a schematic sectional view BB' in embodiments of the disclosure, the first region of the conductive line structure consists of the gate structure 21, the insulating sidewall 24, and the second sub-conductive layer 25, the gate structure 21 consists of the barrier layer 22 and the first sub-conductive layer 23, and the insulating sidewall 24 and the second sub-conductive layer 25 are provided with the third sub-conductive layer 27 thereon.

After the third sub-conductive layer is formed the capping layer is deposited and formed on the plurality of active region structures, the shallow trench isolation structure, and the third sub-conductive layer. That is, the plurality of active region structures, the shallow trench isolation structure, and the third sub-conductive layer are completely capped. For example, as shown in FIG. 1, the plurality of active region structures 11, the shallow trench isolation structure 12, and the third sub-conductive layer 27 are completely capped by the capping layer.

In the embodiments of the disclosure, the substrate is provided the plurality of active region structures and the shadow trench isolation structure are formed on the substrate, the shallow trench isolation structure surrounds the plurality of active region structures; the plurality of active region structures and the shallow trench isolation structure are etched for the first time to form the plurality of conductive line trenches extending parallel to each other along the first direction, in the first etching, the etching rate of the plurality of active region structures is greater than that of the shallow trench isolation structure; the conductive material is filled in the plurality of conductive line trenches to form the conductive line structure, the conductive line structure includes the first region and the second region, the first region is located over each of the plurality of active region structures, the second region is located over the shallow trench isolation structure; the depth of the first region is greater than the depth of the second region. As such, since the etching depth of the first region is greater than that of the second region, so the various first regions are not connected through the shallow trench isolation structure, when a charge loss or leakage occurs, it is possible to avoid data errors of one or more units within the adjacent rows, thereby weakening the impact of the row hammer effect.

Apparently, those skilled in the art may make a variety of modifications and variations of the disclosure without departing from the spirit and scope of the disclosure. Thus, if these modifications and variations of the disclosure are within the scope of the claims and their equivalents thereof, the disclosure is also intended to include these modifications and variations.

What claimed is:

1. A semiconductor storage device, comprising:
   a substrate;
   a plurality of active region structures provided on the substrate;
   a shallow trench isolation structure provided within the substrate, the shallow trench isolation structure surrounding the plurality of active region structures;
   a plurality of conductive line structures extending parallel to each other along a first direction, each of the plurality of conductive line structures comprising a first region and a second region, the first region being located over each of the plurality of active region structures, the second region being located over the shallow trench isolation structure in a direction perpendicular to the substrate, a depth of the first region being greater than a depth of the second region; and,
   wherein the first region of the each of the plurality of conductive line structures further comprises a gate structure, located at a bottom of the first region of the each of the plurality of conductive line structures, the gate structure comprise a barrier layer and a first sub-conductive layer, the barrier layer is located at a portion of sidewalls and a bottom surface of the bottom of the first region of the each of the plurality of conductive line structures, the first sub-conductive layer is provided at the inner-side of the barrier layer;
   wherein the first region of the each of the plurality of conductive line structures further comprises insulating sidewall and a second sub-conductive layer, the insulating sidewall is located at a portion of sidewalls over the bottom barrier layer of the first region, the second sub-conductive layer being provided at the inner-side of the insulating sidewall, the insulating sidewall is provided around the second sub-conductive layer.

2. The semiconductor storage device according to claim 1, wherein the first region of the each of the plurality of conductive line structures further comprises a third sub-conductive layer, the third sub-conductive layer overlies the insulating sidewall and the second sub-conductive layer, and is connected to the second region of each of the plurality of conductive line structures.

3. The semiconductor storage device according to claim 2, wherein the semiconductor storage device further comprises a capping layer, the capping layer is filled inside the second region and overlies the third sub-conductive layer.

4. The semiconductor storage device according to claim 1, wherein a depth of the first region is ½ to ¾ of a depth of the second region.

5. The semiconductor storage device according to claim 1, wherein the barrier layer comprises a metal nitride.

6. The semiconductor storage device according to claim 2, wherein a material of the first sub-conductive layer, a material of the second sub-conductive layer and a material of the third sub-conductive layer are same.

7. The semiconductor storage device according to claim 2, wherein a thickness of the barrier layer is greater than a thickness of the insulating sidewall.

8. The semiconductor storage device according to claim 2, wherein the third sub-conductive layer is provided with an adhesion layer thereon, the adhesion layer comprise a titanium nitride.

9. A method for forming a semiconductor storage device, wherein the semiconductor storage device comprises:
   a substrate;
   a plurality of active region structures provided on the substrate;
   a shallow trench isolation structure provided within the substrate, the shallow trench isolation structure surrounding the plurality of active region structures; and
   a plurality of conductive line structures extending parallel to each other along a first direction, each of the plurality of conductive line structures comprising a first region and a second region, the first region being located over each of the plurality of active region structures, the second region being located over the shallow trench isolation structure in a direction perpendicular to the substrate, a depth of the first region being greater than a depth of the second region; and,
   wherein the first region of the each of the plurality of conductive line structures further comprises a gate structure, located at a bottom of the first region of the each of the plurality of conductive line structures, the gate structure comprise a barrier layer and a first sub-conductive layer, the barrier layer is located at a portion of sidewalls and a bottom surface of the bottom of the first region of the each of the plurality of conductive line structures, the first sub-conductive layer is provided at the inner-side of the barrier layer;
   wherein the first region of the each of the plurality of conductive line structures further comprises insulating sidewall and a second sub-conductive layer, the insulating sidewall is located at a portion of sidewalls over the bottom barrier layer of the first region, the second sub-conductive layer being provided at the inner-side of the insulating sidewall, the insulating sidewall is provided around the second sub-conductive layer; and
   wherein the method comprises:
   providing the substrate;
   forming the plurality of active region structures and the shallow trench isolation structure on the substrate, the shallow trench isolation structure surrounding the plurality of active region structures;
   etching the plurality of active region structures and the shallow trench isolation structure for the first time to form a plurality of conductive line trenches that extend parallel to each other along the first direction, in the etching for the first time, a etching rate of the plurality of active region structures being greater than a etching rate of the shallow trench isolation structure;

forming the plurality of conductive line structures in the plurality of conductive line trenches, each of the plurality of conductive line structures comprising the first region and the second region, the first region being located over each of the plurality of active region structures, the second region being located over the shallow trench isolation structure; a depth of the first region being greater than a depth of the second region; and, wherein forming the conductive line structure in the plurality of conductive line trenches comprises:

depositing to form the barrier layer on a sidewall of the each of the plurality of conductive line structures;

depositing to form the first sub-conductive layer within the barrier layer;

etching back the barrier layer and the first sub-conductive layer, remaining portions of the barrier layer and the first sub-conductive layer located at the bottom of the first region to form the gate structure, wherein the barrier layer is located at the portion of sidewalls and the bottom surface of the bottom of the first region of the each of the plurality of conductive line structures, the first sub-conductive layer is provided at the innerside of the barrier layer;

wherein the etching for the first time comprises:

forming a plurality of first mask structures along the first direction over the plurality of active region structures and the shallow trench isolation structure;

etching the plurality of active region structures and the shallow trench isolation structure according to the plurality of first mask structures, a width of the first mask structure being a first width; and, wherein forming the plurality of conductive line structures in the plurality of conductive line trenches comprises:

depositing an insulating material after the gate structure is formed;

etching back the insulating material to fill a trench over the gate structure;

forming a plurality of second mask structures along the first direction over the insulating material, a width of each of the plurality of second mask structures being a second width, the second width being less than the first width;

etching the insulating material according to the plurality of second mask structures to form insulating sidewall over the barrier layer of the first region; and filling the second sub-conductive layer at the innerside of the insulating sidewall, wherein the second sub-conductive layer is provided at the innerside of the insulating sidewall.

10. The method according to claim 9, wherein forming the plurality of conductive line structures in the plurality of conductive line trenches further comprises:

depositing a fourth sub-conductive layer on the insulating sidewall and the second sub-conductive layer, the fourth sub-conductive layer filling each of the plurality of conductive line trenches.

11. The method according to claim 10, wherein forming the plurality of conductive line structures in the plurality of conductive line trenches further comprises:

forming a plurality of third mask structures along the first direction over a plurality of the fourth sub-conductive layers, a width of each of the plurality of third mask structures being less than the second width;

etching the plurality of the fourth conductive layer according to the plurality of third mask structures to form a plurality of third sub-conductive layers, a width of each of the plurality of third sub-conductive layers is less than or equal to a width of each of the plurality of third mask structures.

12. The method according to claim 11, further comprising:

after forming the plurality of conductive line structures in the plurality of conductive line trenches, depositing to form a capping layer on the plurality of active region structures, the shallow trench isolation structure and the plurality of third sub-conductive layers.

13. The method according to claim 9, wherein a depth of the first region is ½ to ¾ of a depth of the second region.

14. The method according to claim 9, wherein the barrier layer comprises a metal nitride.

15. The method according to claim 11, wherein a material of the first sub-conductive layer, a material of the second sub-conductive layer and a material of the plurality of third sub-conductive layers are same.

* * * * *